(12) United States Patent
Urakami et al.

(10) Patent No.: US 12,100,763 B2
(45) Date of Patent: Sep. 24, 2024

(54) SEMICONDUCTOR DEVICE HAVING CELL SECTION WITH GATE STRUCTURES PARTLY COVERED WITH PROTECTIVE FILM

(71) Applicant: DENSO CORPORATION, Kariya (JP)

(72) Inventors: Yasushi Urakami, Kariya (JP); Jun Saito, Toyota (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 462 days.

(21) Appl. No.: 17/482,840

(22) Filed: Sep. 23, 2021

(65) Prior Publication Data
US 2022/0013666 A1    Jan. 13, 2022

Related U.S. Application Data

(63) Continuation of application No. PCT/JP2020/013670, filed on Mar. 26, 2020.

(30) Foreign Application Priority Data

Mar. 28, 2019    (JP) .................................. 2019-063289

(51) Int. Cl.
*H01L 29/78*    (2006.01)
*H01L 29/10*    (2006.01)

(52) U.S. Cl.
CPC ...... *H01L 29/7813* (2013.01); *H01L 29/1095* (2013.01)

(58) Field of Classification Search
None
See application file for complete search history.

(56) References Cited

U.S. PATENT DOCUMENTS

| 2017/0162458 A1 | 6/2017 | Onozawa |
| 2018/0114789 A1 | 4/2018 | Onishi et al. |
| 2019/0341308 A1* | 11/2019 | Urakami ............. H01L 29/7397 |

FOREIGN PATENT DOCUMENTS

| JP | 2005-197472 A | 7/2005 |
| JP | 2014-003095 A | 1/2014 |

\* cited by examiner

*Primary Examiner* — Daniel Whalen
(74) *Attorney, Agent, or Firm* — Posz Law Group, PLC

(57) ABSTRACT

A semiconductor device includes a cell section having a plurality of gate structures, and an outer peripheral section surrounding the cell section. The cell section includes a semiconductor substrate, the plurality of gate structures, a first electrode and a second electrode. The cell section and the outer peripheral section includes a protective film made of a material having a thermal conductivity lower than that of the first electrode. The protective film extends from the outer peripheral section to an outer edge portion of the cell section adjacent to the outer peripheral section and covers a portion of the first electrode adjacent to the outer peripheral section.

14 Claims, 10 Drawing Sheets

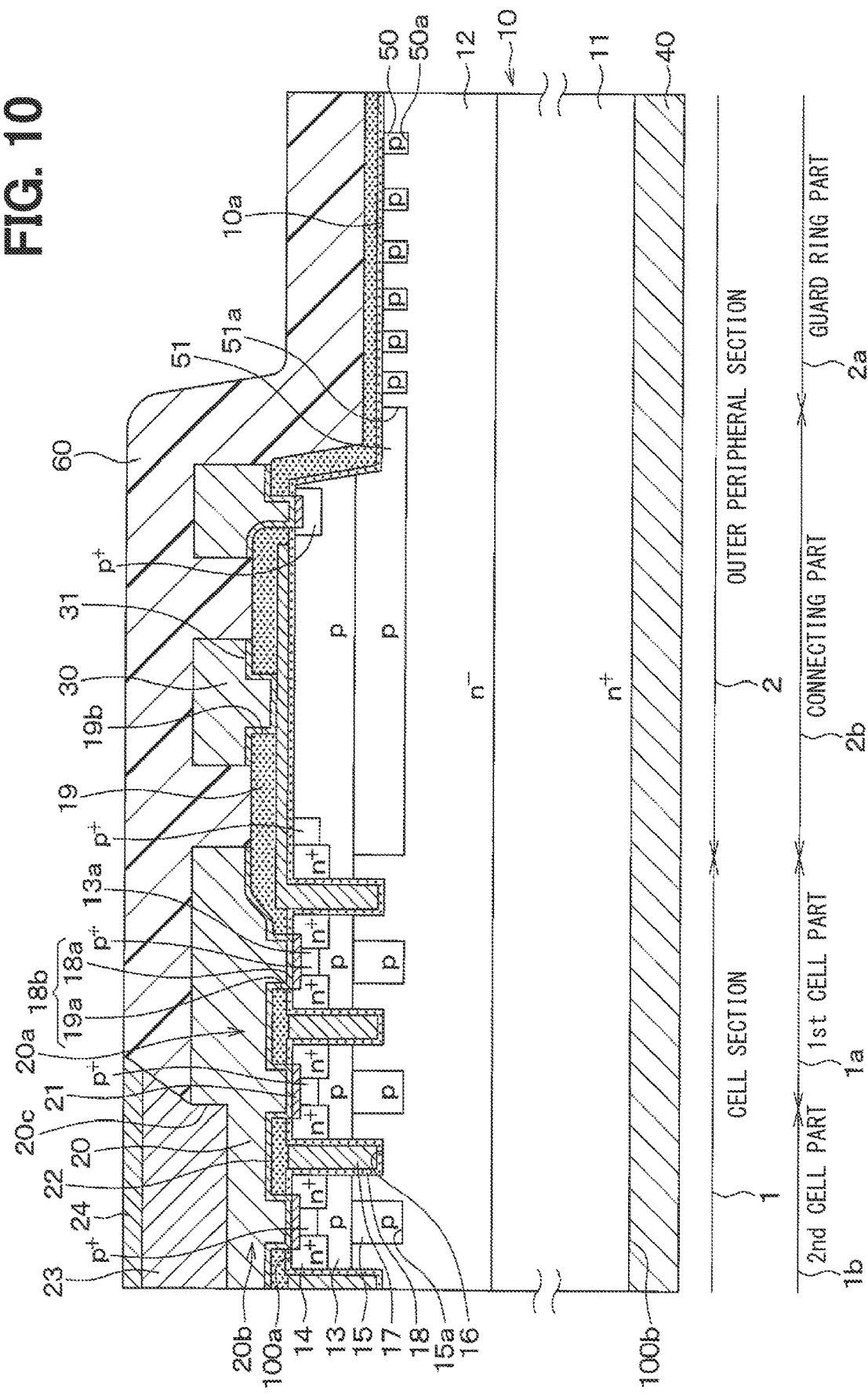

SEMICONDUCTOR DEVICE HAVING CELL SECTION WITH GATE STRUCTURES PARTLY COVERED WITH PROTECTIVE FILM

CROSS REFERENCE TO RELATED APPLICATIONS

The present application is a continuation application of International Patent Application No. PCT/JP2020/013670 filed on Mar. 26, 2020, which designated the U.S. and claims the benefit of priority from Japanese Patent Application No. 2019-063289 filed on Mar. 28, 2019. The entire disclosures of all of the above applications are incorporated herein by reference.

TECHNICAL FIELD

The present disclosure relates to a semiconductor device having a plurality of gate structures, in which at least one of the gate structures is arranged below a protective film.

BACKGROUND

For example, there is known a semiconductor device having a cell section and an outer peripheral section. The outer peripheral section surrounds the cell section and has a structure for improving withstand voltage such as a guard ring. The cell section is formed with a semiconductor element having a gate structure. In such a semiconductor device, for example, the cell section is formed with a metal oxide semiconductor field effect transistor (MOSFET) element. The cell section includes a drift layer, a base region formed in a surface layer portion of the drift layer, a source region formed in a surface layer portion of the base region, and a drain layer formed on a side opposite to the base region with respect to the drift layer. The cell section has a trench gate structure in which a trench is formed so as to penetrate the source region and the base region, and a gate insulating film is formed on the inner wall surface of the trench, and a gate electrode is formed on the gate insulating film. The gate insulating film is also formed on a surface other than the inner wall surface of the trench, and is formed so as to cover a part of the source region. A portion of the gate insulating film formed on the surface other than the inner wall surface of the trench is formed with a contact hole so as to expose a remaining part of the source region.

In the cell section, an interlayer insulating film is formed on the MOSFET element. In the cell section, a first electrode is arranged so as to be electrically connected to the source region and the base region through a contact hole formed in the interlayer insulating film and a contact hole formed in the gate insulating film. The first electrode is made of a metal material, and is arranged so as to be embedded in the contact hole of the interlayer insulating film and the contact hole of the gate insulating film. In the cell section, further, a second electrode is arranged so as to be electrically connected to the drain layer.

Further, in the semiconductor device described above, a protective film is formed on the outer peripheral section. Specifically, the protective film is formed to extend from the outer peripheral section to an outer edge portion of the cell section in order to suppress an occurrence of creeping discharge between the first electrode and the second electrode. That is, the first electrode has a configuration in which the outer edge portion is covered with the protective film. Therefore, at the outer edge portion of the cell section, the trench gate structure is located under the protective film. The protective film is made of, for example, boro-phospho silicate glass. That is, the protective film is made of a material having a lower thermal conductivity than that of the first electrode.

SUMMARY

The resent disclosure provides a semiconductor device including a cell section having the plurality of gate structures, and an outer peripheral section surrounding the cell section. The cell section includes a semiconductor substrate, a plurality of gate structures, a first electrode and a second electrode. The cell section and the outer peripheral section includes a protective film made of a material having a thermal conductivity lower than that of the first electrode. The protective film extends from the outer peripheral section to an outer edge portion of the cell section adjacent to the outer peripheral section and covers a portion of the first electrode adjacent to the outer peripheral section.

BRIEF DESCRIPTION OF DRAWINGS

Features and advantages of the present disclosure will become more apparent from the following detailed description made with reference to the accompanying drawings, in which:

FIG. 10 is a cross-sectional view of a SiC semiconductor device according to further another embodiment of the present disclosure.

DETAILED DESCRIPTION

Figure 1:
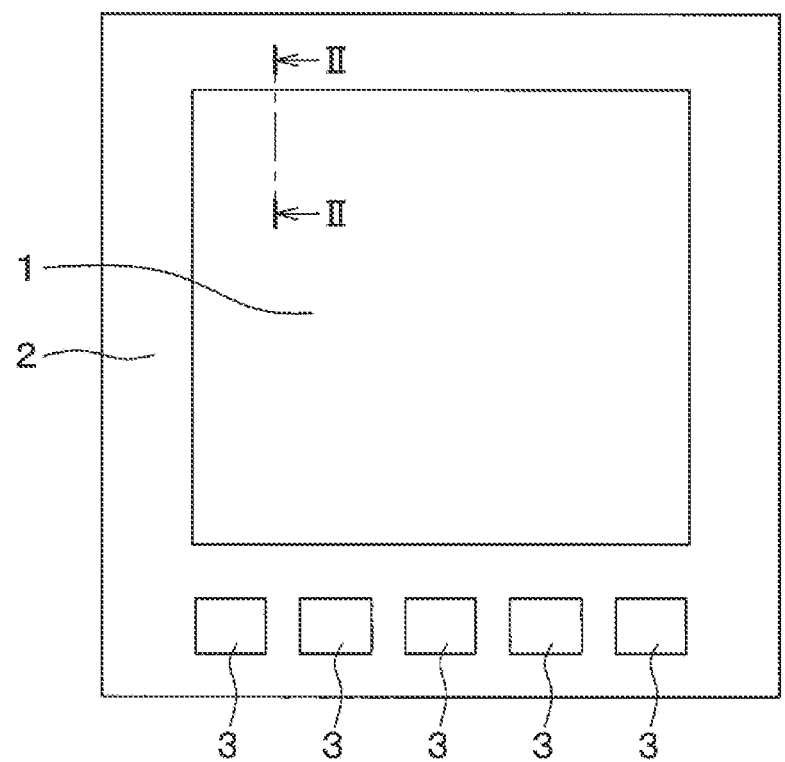
FIG. 1 is a plan view of a SiC semiconductor device according to a first embodiment of the present disclosure.

In such a semiconductor device, when a predetermined gate voltage is applied to a gate electrode, a channel region is formed in a base region that is in contact with a side surface of a trench. As a result, a semiconductor element is brought into an on state in which a current flows between a first electrode and a second electrode via a source region, the channel region, and a drift layer.

However, when the semiconductor device is in the on state, the first electrode generates heat due to the current flowing inside the first electrode. Since a protective film has a low thermal conductivity, a heat dissipation property is low. In this case, therefore, the temperature of the first electrode is likely to be higher at a portion covered with the protective film than a portion exposed from the protective film. This phenomenon becomes remarkable especially in a short-circuited state in which a large current flows rapidly. In the semiconductor device described above, therefore, the portion of the first electrode covered with the protective film may thermally expand, and thus a gate insulating film located in the vicinity of the portion may be compressed and destroyed.

It should be noted that such a phenomenon can occur not only in the case where the MOSFET element is formed in the cell section but also in a case, for example, where an insulated gate bipolar transistor (IGBT) element is formed in the cell section. Further, such a phenomenon may occur even in a case where a planar gate structure is formed in the cell section, instead of the trench gate structure.

The present disclosure provides a semiconductor device which is capable of suppressing the breakdown of a gate insulating film.

According to a first aspect of the present disclosure, a semiconductor device includes a cell section, and an outer peripheral section surrounding the cell section. The cell section includes a semiconductor substrate, a plurality of gate structures, a first electrode, and a second electrode. The semiconductor substrate has a first surface, and includes: a drift layer of a first conductivity type; a base region of a second conductivity type, the base region being disposed on the drift layer and adjacent to the first surface; a first high impurity concentration region of a first conductivity type, the first high impurity concentration region having an impurity concentration higher than that of the drift layer, and being disposed in a surface layer portion of the base region; and a second high impurity concentration region of a first conductivity type or a second conductivity type, the second high impurity concentration region having an impurity concentration higher than that of the drift layer, and being disposed opposite to the base region with respect to the drift layer. Each of the gate structures includes a gate insulating film disposed in a part including a surface of the base region interposed between the first high impurity concentration region and the drift layer, and a gate electrode disposed on the gate insulating film. The first electrode is electrically connected to the base region and the first high impurity concentration region through a contact hole of the gate insulating film, the contact hole being at a part different from a part on which the gate electrode is disposed. The second electrode is electrically connected to the second high impurity concentration region. The cell section and the outer peripheral section includes a protective film made of a material having a lower thermal conductivity than that of the first electrode, the protective film extending from the outer peripheral section to an outer edge portion of the cell section adjacent to the outer peripheral section and covering a portion of the first electrode adjacent to the outer peripheral section. The cell section includes a first cell part in a region that overlaps with the protective film in a stacking direction of the drift layer and the base region, and a second cell part in a region different from the first cell part, the gate structures are disposed in the first cell part and the second cell part. The first electrode has a first electrode part located in the first cell part, and a second electrode part located in the second cell part. The first electrode part includes a thick portion having a film thickness greater than that of the second electrode part, the film thickness being defined by a thickness of the first electrode from the first surface of the semiconductor substrate to a surface of the first electrode opposite to the first surface of the semiconductor substrate.

In such a configuration, when the semiconductor device is in an on state, heat generation at a first electrode part can be reduced, as compared with a configuration in which the first electrode part has the same film thickness as the second electrode part. Therefore, it is possible to suppress the gate insulating film being applied with a large stress from the first electrode part, and it is thus possible to suppress the breakdown of the gate insulating film.

According to a second aspect of the present disclosure, a semiconductor device includes a cell section, and an outer peripheral section surrounding the cell section. The cell section includes: a drift layer of a first conductivity type; a base region of a second conductivity type, the base region being disposed on the drift layer; a first high impurity concentration region of a first conductivity type, the first high impurity concentration region having an impurity concentration higher than that of the drift layer, and being disposed in a surface layer portion of the base region; a plurality of gate structures, each of the gate structures includes a gate insulating film disposed in a part including a surface of the base region interposed between the first high impurity concentration region and the drift layer, and a gate electrode disposed on the gate insulating film; a second high impurity concentration region of a first conductivity type or a second conductivity type, the second high impurity concentration region having an impurity concentration higher than that of the drift layer, and being disposed opposite to the base region with respect to the drift layer; a first electrode being electrically connected to the base region and the first high impurity concentration region through a contact hole of the gate insulating film, the contact hole being at a part different from a part on which the gate electrode is disposed, and a second electrode being electrically connected to the second high impurity concentration region. The cell section and the outer peripheral section includes a protective film made of a material having a lower thermal conductivity than that of the first electrode. The protective film extends from the outer peripheral section to an outer edge portion of the cell section adjacent to the outer peripheral section and covers a portion of the first electrode adjacent to the outer peripheral section. The cell section includes a first cell part in a region that overlaps with the protective film in a stacking direction of the drift layer and the base region, and a second cell part in a region different from the first cell part. The gate structures are disposed in the first cell part and the second cell part. The first electrode part of the first electrode located in the first cell part is made of a material having a lower resistivity than the second electrode part located in the second cell part.

In such a configuration, when the semiconductor device is in an on state, heat generation at the first electrode part can be reduced as compared with a configuration in which the first electrode part is made of the same material as the second electrode part. Therefore, it is possible to suppress the gate insulating film being applied with a large stress from the first electrode part, and it is thus possible to suppress the breakdown of the gate insulating film.

Embodiments of the present disclosure will be described hereinafter with reference to the drawings. In the embodiments described hereinafter, the same or equivalent parts will be designated with the same reference numerals.

First Embodiment

A first embodiment will be described with reference to the drawings. In the present embodiment, as a semiconductor device, a SiC semiconductor device having an inverted MOSFET element with a trench gate structure as a semiconductor element will be exemplified.

Figure 2:
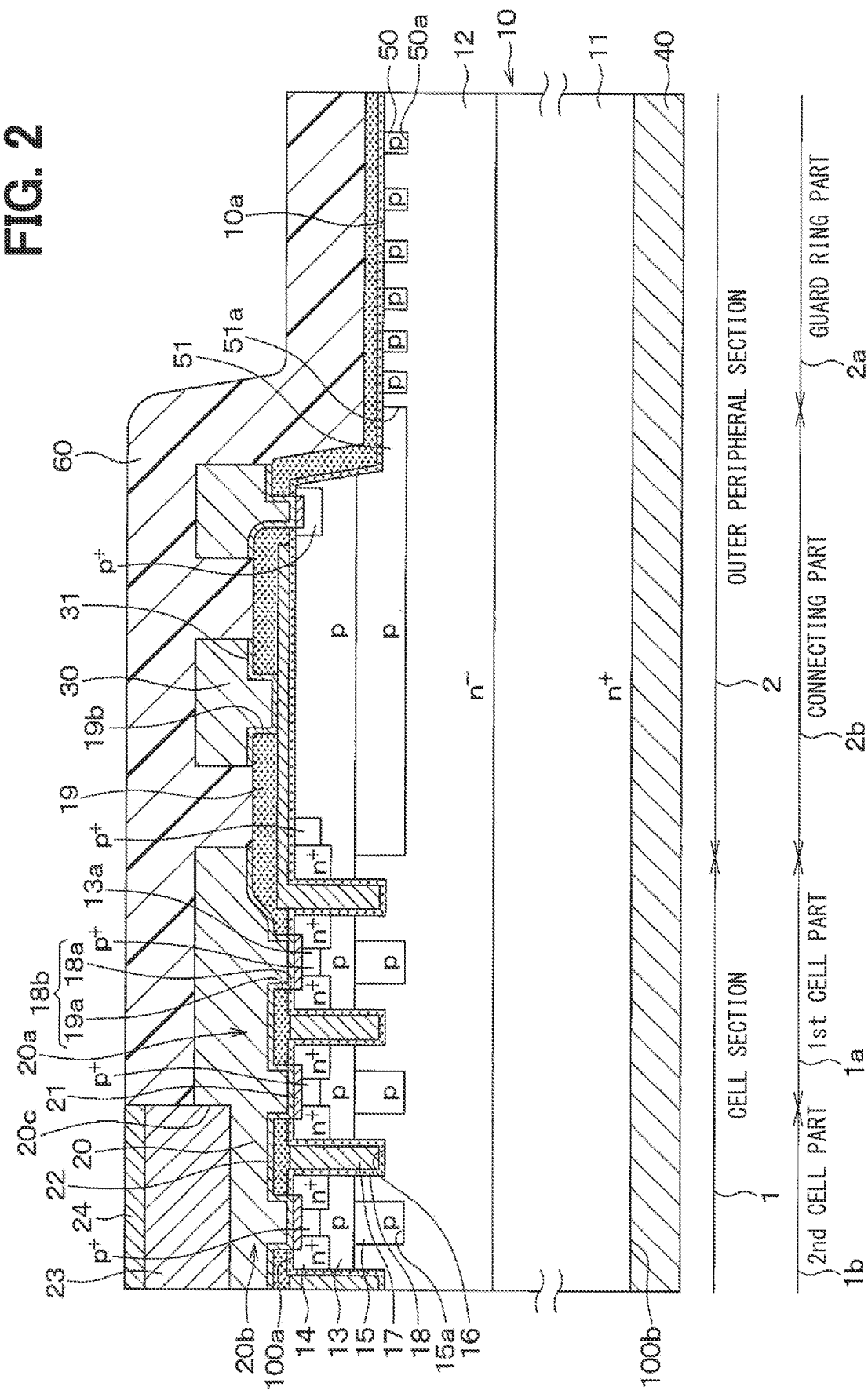
FIG. 2 is a cross-sectional view taken along a line II-II in FIG. 1.

As shown in FIGS. 1 and 2, the SiC semiconductor device is configured to include a cell section formed with a MOSFET element having a trench gate structure and an outer peripheral section 2 surrounding the cell section 1. The outer peripheral section 2 is configured to have a guard ring part 2a and a connecting part 2b arranged inside the guard ring part 2a. In other words, the outer peripheral section 2 is configured to have the guard ring portion 2a and the connecting portion 2b arranged between the cell section 1 and the guard ring portion 2a. In the present embodiment, a configuration having one cell section 1 and an outer peripheral section 2 surrounding the cell section 1 will be described. However, the SiC semiconductor device may have a plurality of cell sections 1. In such a case, the portion located between adjacent cell sections 1 is also the outer peripheral section 2, for example. Therefore, the SiC semiconductor device may have the outer peripheral section 2 also in a substantially middle portion of the SiC semiconductor device.

As shown in FIG. 2, the SiC semiconductor device is provided by using a semiconductor substrate 10. Specifically, the semiconductor substrate 10 has an n$^+$-type substrate 11 that forms a high impurity concentration layer made of SiC. An n$^-$-type drift layer 12 made of SiC is formed on the substrate 11. The drift layer 12 has a lower impurity concentration than that of the substrate 11, and is epitaxially grown on the substrate 11. A p-type base region 13 is epitaxially grown on the drift layer 12, and an n$^+$-type source region 14 is further formed in a surface layer portion of the base region 13. The semiconductor substrate 10 has one surface (first surface) 100a adjacent to the base region 13, and another surface (second surface) 100b opposite to the one surface 100a. The one surface 100a is provided by surfaces of the source region 14 and the like, and the other surface 100b is provided by the back surface of the substrate 11 and the like.

The n$^+$-type substrate 11 has, for example, an n-type impurity concentration of $1.0\times10^{19}$/cm$^3$. The surface of the n$^+$-type substrate 11 is a (0001) Si surface. The n$^-$-type drift layer 2 has a lower impurity concentration than that of the n$^+$-type substrate 11, for example, an n-type impurity concentration of 0.5 to $2.0\times10^{16}$/cm$^3$.

Further, the p-type base region 13 has a portion where a channel region is to be formed. The p-type base region 13 has the p-type impurity concentration of, for example, about $2.0\times10^{17}$/cm$^3$ and the thickness of 300 nm. The n$^+$-type source region 4 has a higher impurity concentration than that of the n$^-$-type drift layer 2. The source region 14 has the n-type impurity concentration of, for example, $2.5\times10^{18}$ to $1.0\times10^{19}$/cm$^3$ in the surface layer portion, and the thickness of about 0.5 μm. In the present embodiment, the source region 14 corresponds to a first high impurity concentration region.

In the cell section 1 and the connecting part 2b, the base region 13 is left on the front surface side of the substrate 11. In the guard ring portion 2a, a recess 10a is formed so as to penetrate the base region 13 and reach the drift layer 12. Such a structure forms a mesa structure.

In the cell section 1 and the connecting portion 2b, a contact region 13a formed of p-type high concentration layers is formed on the surface of the base region 13.

In the cell section 1, p-type deep layers 15 are formed below the base region 13, that is, in the surface layer portion of the drift layer 12. The deep layers 15 have a p-type impurity concentration higher than that of the p-type base region 13. The deep layers 15 extend in a direction perpendicular to a paper surface of FIG. 2, that is, in the same direction as an extending direction of a trench gate structure, which will be described later, as the longitudinal direction. Specifically, the deep layers 15 are arranged in the drift layer 12 at an equal interval. The deep layers 15 are provided in trenches 15a that have a striped pattern and are arranged apart from each other without intersections. For example, each of the deep layers 15 has a p-type impurity concentration of $1.0\times10^{17}$ to $1.0\times10^{19}$ cm$^3$, a width of 0.7 μm, and a depth of about 2.0 μm.

The semiconductor substrate 10 is formed with gate trenches 16. Each of the gate trenches 16 extends from the one surface 100a while penetrating through the base region 13 and the source region 14, and reaches the drift layer 12. For example, the gate trench 16 has a width of 0.8 μm and a depth of 1.0 μm. In other words, the base region 13 and the source region 14 are arranged so as to be in contact with the side surface of the gate trench 16. In the present embodiment, a plurality of gate trenches 16 are formed in parallel at equal intervals, with the horizontal direction of the paper surface of FIG. 2 being the width direction, the direction perpendicular to the paper surface of FIG. 2 being the longitudinal direction, and the vertical direction of the paper surface of FIG. 2 being the depth direction. That is, in the present embodiment, the gate trench 16 extends in a direction intersecting a stacking direction of the drift layer 12 and the base region 13 (hereinafter, simply referred to as a stacking direction). Specifically, the gate trench 16 extends in the direction orthogonal to the stacking direction. In other words, the plurality of gate trenches 16 extend along one direction included in a planar direction of the substrate 11. The gate trenches 16 have an annular structure by being routed around at the tip end portion in the extending direction. The gate trenches 16 may have a striped pattern in which a plurality of gate trenches 16 are formed in parallel and at equal intervals.

The gate trench 16 is filled with a gate electrode 17 and a gate insulating film 18. That is, assuming that the portion of the base region 13 located on the side surface of the gate trench 16 is a channel region connecting the source region 14 and the drift layer 12 when the vertical MOSFET element is operated, the gate insulating film 18 is formed on an inner wall surface of the gate trench 16 including the channel region. The gate insulating film 18 is made of, for example, a thermal oxide film or the like. The gate electrode 17 is formed on the surface of the gate insulating film 18. The gate electrode 17 is made of doped poly-Si.

The gate insulating film 18 is formed also on the surface, in addition to the inner wall surface of the gate trench 16. Specifically, the gate insulating film 18 is formed so as to cover a part of the one surface 100a of the semiconductor substrate 10. More specifically, the gate insulating film 18 is formed so as to cover a part of the surface of the source region 14. The gate insulating film 18 is formed with a contact hole 18a at a position different from the position where the gate electrode 17 is formed. The contact hole 18a is formed to expose a surface of the contact region 13a and a remaining part of the surface of the source region 14.

The gate insulating film 18 is also formed on the surface of the base region 13 in the connecting portion 2b. Similarly to the gate insulating film 18, the gate electrode 17 extends to the connecting portion 2b. The gate electrode 17 extends over the surface of the gate insulating film 18 in the connecting portion 2b. The trench gate structure of the present embodiment has the configuration as described above.

An interlayer insulating film 19 is formed on the one surface 100a of the semiconductor substrate 10 so as to cover the gate electrode 17, the gate insulating film 18, and the like. The interlayer insulating film 19 is made of a material softer than the gate insulating film 18. The interlayer insulating film 19 is made of BPSG or the like.

The interlayer insulating film 19 is formed with a contact hole 19a that communicates with the contact hole 18a and exposes the source region 14 and the contact region 13a. The interlayer insulating film 19 is further formed with a contact hole 19b that exposes a portion of the gate electrode 17 extended in the connecting portion 2b. That is, the interlayer insulating film 19 has the contact hole 19a in the cell section 1 and the contact hole 19b in the outer peripheral section 2. Since the opening region of the contact holes 19a and 19b is greater in the cell section 1 than in the outer peripheral section 2, the density of the contact holes 19a and 19b is higher in the cell section 1 than in the outer peripheral section 2.

The contact hole 19a of the interlayer insulating film 19 is formed so as to communicate with the contact hole 18a of the gate insulating film 18, and functions as one contact hole together with the contact hole 18a. Therefore, the contact hole 18a and the contact hole 19a are hereinafter collectively referred to as a contact hole 18b. The pattern of the contact hole 18b is arbitrary. For example, the contact hole 18b has a pattern in which a plurality of square holes are arranged, a pattern in which rectangular line-shaped holes are arranged, a pattern in which line-shaped holes are arranged, or the like. In the present embodiment, the contact hole 18b has a line shape along the longitudinal direction of the gate trench 16.

A source electrode 20 is formed on the interlayer insulating film 19. The source electrode 20 is electrically connected to the source region 14 and the contact region 13a through the contact hole 18b. Further, a gate wiring 30 is formed on the interlayer insulating film 19. The gate wiring 30 is electrically connected to the gate electrode 17 through the contact hole 19b. In the present embodiment, the source electrode 20 corresponds to a first electrode.

In the present embodiment, the source electrode 20 is connected to the source region 14 and the contact region 13a as follows. Specifically, a metal silicide 21 made of a metal such as nickel (Ni) is formed in a portion exposed from the contact hole 18b on the source region 14 and the contact region 13a. The metal silicide 21 is provided for reducing the contact resistance between the source region 14 and the contact region 13a and the source electrode 20.

A barrier metal 22 made of titanium (Ti), titanium nitride (TiN), or the like is formed on the metal silicide 21. The barrier metal 22 is formed also along the wall surface of the contact hole 18b and the surface of the interlayer insulating film 19. In the present embodiment, the source electrode 20 is made of an aluminum-silicon (Al—Si) layer as will be described later. Therefore, the barrier metal 22 has a role of suppressing diffusion of Al contained in the Al—Si layer toward the semiconductor substrate 10 or the interlayer insulating film 19. The barrier metal 22 also plays a role of suppressing diffusion of Ni in the metal silicide 21 toward the Al—Si layer.

The source electrode 20 is arranged on the barrier metal 22, and is connected to the source region 14 and the contact region 13a via the barrier metal 22 and the metal silicide 21. In the present embodiment, the source electrode 20 is provided by the Al—Si layer containing Al as a main component. Alternatively, the source electrode 20 may be made of only Al or another material containing Al as a main component, in place of the Al—Si layer. In the present embodiment, the source electrode 20 is formed to extend up to the vicinity of the boundary portion between the cell section 1 and the outer peripheral section 2.

The gate wiring 30 is connected to the gate electrode 17 as follows. That is, a barrier metal 31 made of TiN or the like is formed on a portion of the gate electrode 17 exposed from the contact hole 19b. The barrier metal 31 is also formed along the wall surface of the contact hole 19b and the surface of the interlayer insulating film 19. In the present embodiment, the gate wiring 30 is made of Al—Si, as will be described later. Therefore, the barrier metal 31 is provided to play a role of suppressing diffusion of Al contained in the al-Si of the gate wiring 30 toward the semiconductor substrate 10 and the interlayer insulating film 19.

The gate wiring 30 is arranged on the barrier metal 31, and is connected to the gate electrode 17 through the barrier metal 31. In the present embodiment, the gate wiring 30 is provided by an Al—Si layer, similar to the source electrode 20. The gate wiring 30 is appropriately routed and electrically connected to one of pads 3 shown in FIG. 1.

Although not described in detail in the present embodiment, the SiC semiconductor device is appropriately formed with a current sense, a temperature sense, and the like. These senses are appropriately, electrically connected to respective pads 3 shown in FIG. 1.

Further, a Ni plating layer 23 and an Au layer 24 are formed and stacked on the source electrode 20 for improving solder wettability at the time of forming connection to a external member through the source electrode 20. Although the source electrode 20 extends up to the boundary portion between the cell section 1 and the outer peripheral section 2, the Ni plating layer 23 and the Au layer 24 are not extended up to the boundary portion. That is, the Ni plating layer 23 and the Au layer 24 are formed so as to expose the outer edge portion of the source electrode 20. Although not particularly shown, an Au layer may be formed on the gate wiring 30 via a Ni plating layer.

A drain electrode 40 is formed on the back surface side of the substrate 11, that is, adjacent to the other surface 100b of the semiconductor substrate 10. The drain electrode 40 is electrically connected to the substrate 11. The drain electrode 40 corresponds to a second electrode. The structure described above forms a MOSFET of an n-channel type inverted trench gate structure. Such MOSFETs are arranged in multiple cells, to thereby form the cell section 1. In the present embodiment, the substrate 11 forms a drain layer and corresponds to a second high impurity concentration region.

In the guard ring portion 2a, as described above, the recess 10a is formed so as to penetrate the source region 14 and the base region 13 and reach the drift layer 12. Therefore, the source region 14 and the base region 13 are removed at a position away from the cell section 1, and the drift layer 12 is exposed. The cell section 1 and the connecting portion 2b located on an inner side of the recess 10a protrude in the thickness direction of the substrate 11, and form a mesa portion in an island shape. Thus, a step is formed between the cell section 1 and connecting portion 2b and the guard ring portion 2a.

Further, a plurality of p-type guard rings 50 are provided in the surface layer portion of the drift layer 12 located below the recess 10a so as to surround the cell section 1. In the present embodiment, the upper surface of the guard ring 50 has, as an upper surface layout, a quadrangular shape with rounded four corners, a circular shape, or the like, when viewed in the stacking direction. For example, the guard ring 50 is arranged in the trench 50a formed in the surface layer portion of the drift layer 12. The guard ring 50 is, for example, provided by a p-type epitaxial film formed by epitaxial growth.

Note that "viewing in the stacking direction" means viewing in a normal direction to the planar direction of the substrate 11. Further, although not shown, the guard ring portion 2a may be provided with an outer peripheral voltage withstand structure surrounding the cell section 1, as needed, by providing an equipotential ring (EQR) structure on the outer periphery of the guard ring 50.

The connecting portion 2b is formed in the area from the cell section 1 to the guard ring portion 2a. A p-type resurf layer 51 is provided in the surface layer portion of the drift layer 12, in the connecting part 2b and an inner peripheral side of the guard ring portion 2a. For example, when viewed in the stacking direction, the connecting portion 2b is formed so as to surround the cell section 1, and the plurality of guard rings 50 having a quadrangular shape with rounded four corners are formed so as to surround the outer periphery of the connecting portion 2b. The resurf layer 51 is extended so as to reach the guard ring portion 2a while surrounding the cell section 1. The resurf layer 51 is also arranged in the trench 51a formed in the surface layer portion of the drift layer 12. The resurf layer 51 is provided by an epitaxial film formed by epitaxial growth.

By forming such a resurf layer 51, the equipotential lines can be guided toward the guard ring portion 2a side, and an occurrence of a concentration of the electric fields in the connecting portion 2b can be suppressed. Therefore, it is possible to suppress the decrease in withstand voltage.

Further, a protective film 60 is formed to as to cover the connecting portion 2b and the guard ring portion 2a. The protective film 60 is made of polyimide or the like. In the present embodiment, the protective film 60 is formed from the outer peripheral section 2 to the outer edge portion of the cell section 1 in order to suppress the occurrence of creeping discharge between the source electrode 20 and the drain electrode 40. Specifically, the protective film 60 is formed so as to cover the portion of the source electrode 20 exposed from the Ni plating layer 23 and the Au layer 24, and to expose the Ni plating layer 23 and the Au layer 24. That is, the protective film 60 is formed so as to cover the outer edge portion of the source electrode 20 on the outer peripheral section 2 side. In the present embodiment, the protective film 60 is formed as described above, and the trench gate structure is located also below the protective film 60.

Hereinafter, a part of the cell section 1 that overlaps with the protective film 60 will be referred to as a first cell part 1a, and a part of the cell section 1 that does not overlap with the protective film 60 will be referred to as a second cell part 1b. That is, in the following, the part of the cell section 1 located below the protective film 60 is referred to as the first cell part 1a, and the part of the cell section 1 located below the protective film 60 is referred to as the second cell part 1b. Therefore, the source electrode 20 is covered with the protective film 60 in the first cell part 1a, and is exposed from the protective film 60 in the second cell part 1b. As shown in FIG. 1, since the outer peripheral section 2 is arranged so as to surround the cell section 1, the first cell part 1a is located so as to surround the second cell part 1b.

The SiC semiconductor device of the present embodiment has the configuration as described above, as the basic configuration. Note that, in the present embodiment, N$^+$-type and N$^-$-type correspond to a first conductivity type, and P-type and P$^+$-type correspond to a second conductivity type.

In the source electrode 20, the length between the one surface 100a of the semiconductor substrate 10 and the surface of the source electrode 20 opposite to the one surface 100a of the semiconductor substrate 10 is defined as the film thickness. In the present embodiment, the source electrode 20 has a configuration in which a first part 20a located in the first cell part 1a has a portion having a larger film thickness than the film thickness of a second part 20b located in the second cell part 1b. The first part 20a will be also referred to as a first electrode part, and the second part 20b will be also referred to as a second electrode part. The source electrode 20 has a shape in which the first part 20a as a whole is thicker than the second part 20b, and thus the source electrode 20 has a step 20c at the boundary portion between the first part 20a and the second part 20b.

The source electrode 20 is formed as follows, for example. That is, after forming the metal silicide 21 and the barrier metal 22, the Al—Si film for forming the source electrode 20 is formed by sputtering or the like. After that, a part of the Al—Si film to be the second part 20b is etched more times than the part of the Al—Si film to be the first part 20a, so that the film thickness of the second part 20b is made smaller than the film thickness of the first part 20a. As a result, the source electrode 20 in which the film thickness of the first part 20a is greater than the film thickness of the second part 20b is formed.

The configuration of the semiconductor device according to the present embodiment has been described hereinabove. In the SiC semiconductor device described above, when the MOSFET element is turned on, the voltage equal to or higher than a threshold voltage Vt of the trench gate structure is applied to the gate electrode 17, to thereby form a channel region in the surface of the base region 13 located on the side surface of the gate trench 16. As a result, electrons are injected from the source electrode 20 into the source region 14, and the electrons flow from the source region 14 to the drain electrode 40 via the channel region and the drift layer 12. In this way, the current is caused to flow between the source electrode 20 and the drain electrode 40, and thus the MOSFET element is brought into an on state.

At this time, in the source electrode 20, the current flows between the contact portion with the Ni plating layer 23 and the contact portion with the source region 14. The source electrode 20 generates heat due to the flow of the current, and the amount of heat generation increases as a resistance increases.

In this case, in the first part 20a of the source electrode 20, the current flows from the contact portion with the source region 14 toward the contact portion with the Ni plating layer 23 and also flows along the planar direction of the substrate 11. Therefore, in the present embodiment, the first part 20a has the portion having the film thickness greater than that of the second part 20b. As a result, since the first part 20a has a larger cross-sectional area with respect to the direction of the current flow, the resistance of the first part 20a is made smaller, as compared with a configuration in which the film thickness of the first part 20a is the same as that of the second part 20b. Therefore, the amount of heat generation at the first part 20a can be reduced.

In the second part 20b of the source electrode 20, the current flows from the contact portion with the source region 14 toward the contact portion with the Ni plating layer 23 along the stacking direction.

Further, at the time of reverse bias, the current flows towards the guard ring part 2a, since the resurf layer 51 is formed in the connecting portion 2b to suppress the rising of the equipotential lines. In the guard ring portion 2a, the guard ring 50 allows the equipotential lines to be terminated while expanding toward the outer peripheral region, and thus a desired withstand voltage can be achieved also in the guard ring part 2a. Therefore, the SiC semiconductor device capable of having a desired withstand voltage can be obtained.

Figure 3:
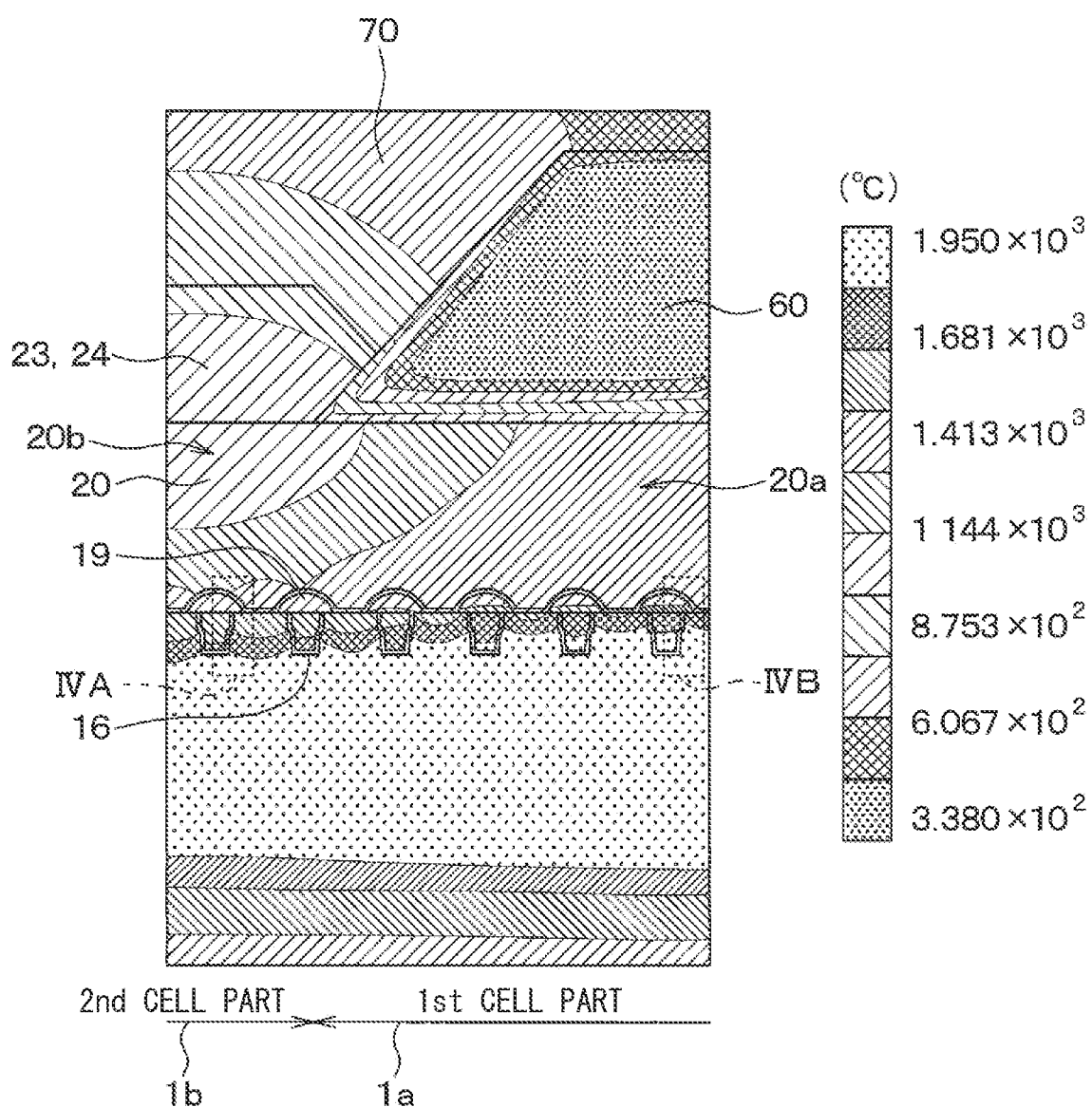
FIG. 3 is a diagram showing a simulation result regarding a temperature distribution in the vicinity of a boundary portion between a first cell part and a second cell part in an on state in a SiC semiconductor device of a comparative example.
Figure 4A:
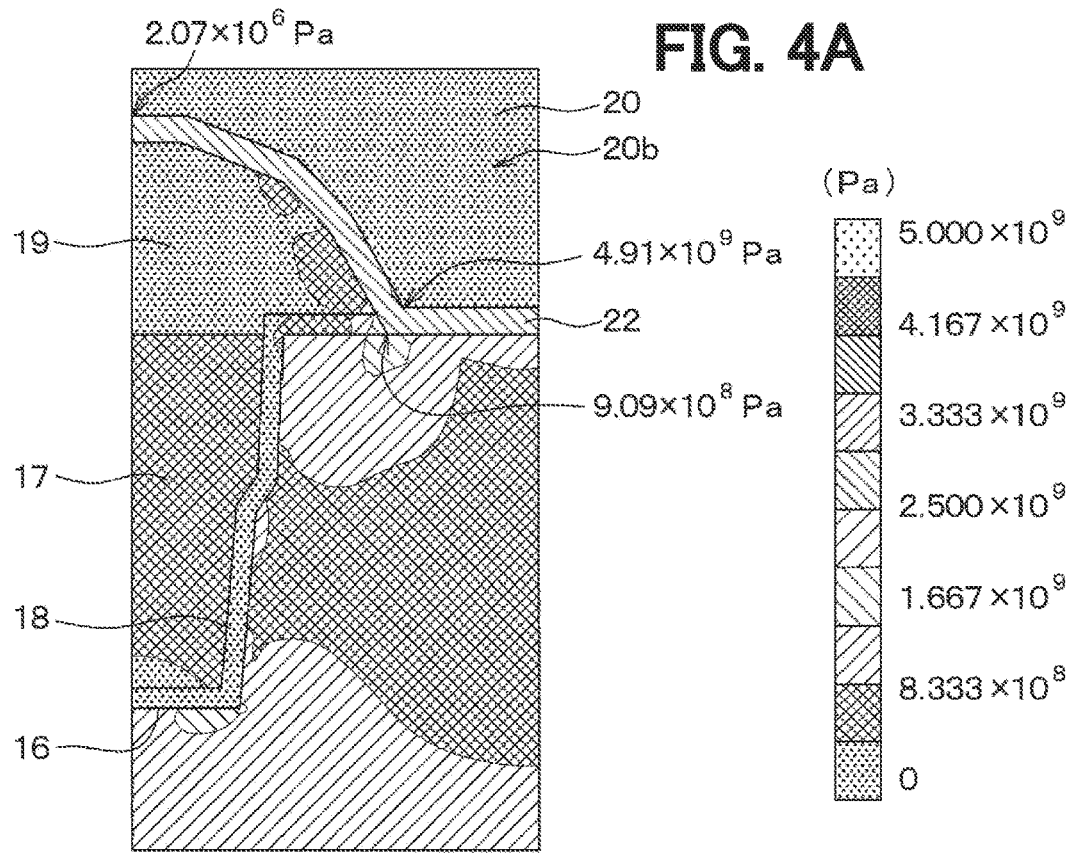
FIG. 4A is a diagram showing a simulation result regarding a stress distribution in a region IVA in FIG. 3.
Figure 4B:
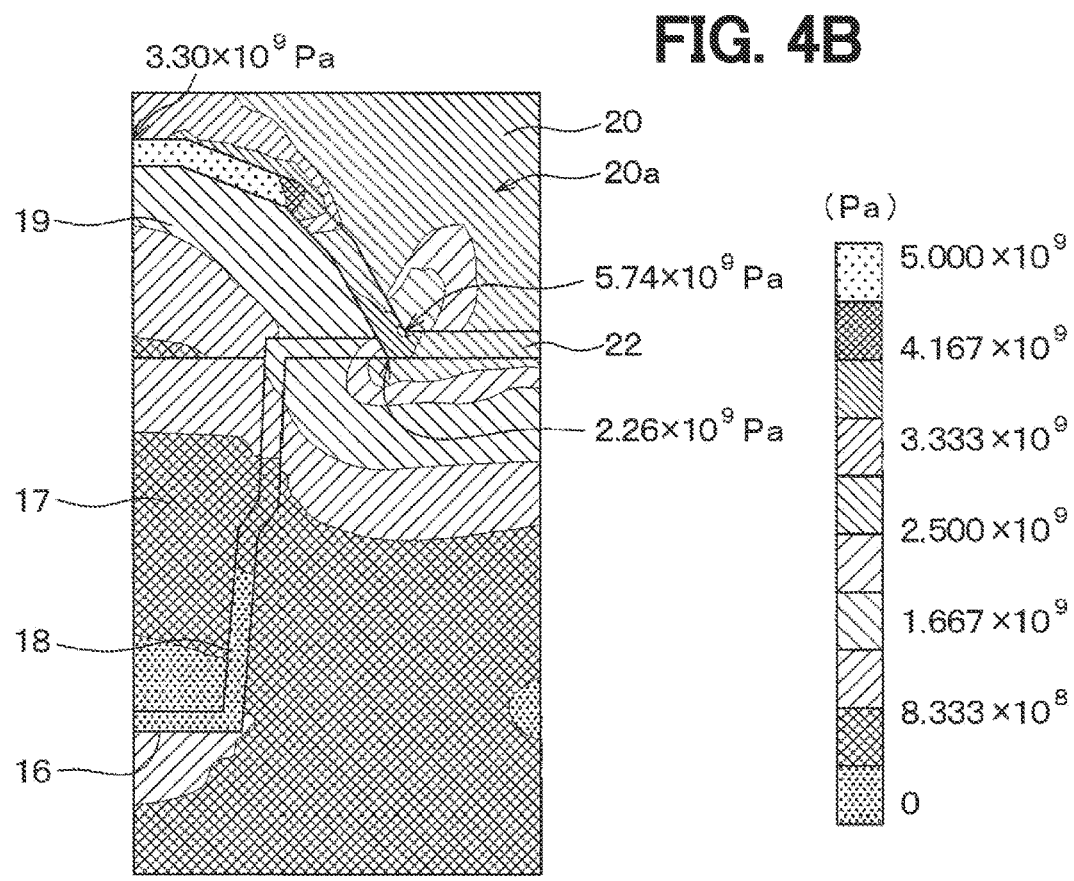
FIG. 4B is a diagram showing a simulation result regarding a stress distribution in a region IVB in FIG. 3.

Next, in regard to a SiC semiconductor device in which the first part 20a and the second part 20b have the same film thickness, a temperature distribution and a stress distribution when the SiC semiconductor device is in an on state will be described with reference to FIGS. 3, 4A and 4B. In the following, the SiC semiconductor device in which the first part 20a and the second part 20b have the same film thickness will be simply referred to as a comparative SiC semiconductor device or the SiC semiconductor device of a comparative example. FIG. 3 shows a simulation result of a configuration in which a solder 70 is arranged above a source electrode 20 via a Ni plating layer 23 and an Au layer 24, and in which detailed components such as the source region 14 are omitted. The numerical values in FIGS. 4A and 4B indicate the Mises stress.

First, as shown in FIG. 3, when the comparative SiC semiconductor device is in the on state, it is confirmed that the temperature of the first cell part 1a is higher than the temperature of the second cell part 1b, because of the protective film 60 having the lower thermal conductivity than the source electrode 20 and thus having the lower heat dissipation. Further, as shown in FIGS. 4A and 4B, it is confirmed that the thermal stress generated in the first part 20a is larger than the thermal stress generated in the second part 20b, and thus the thermal stress applied to the gate insulating film 18 in the first part 20a is larger than that in the second part 20b. That is, it is confirmed that a larger thermal stress is applied to the gate insulating film 18 in the vicinity of the first part 20a than in the gate insulating film 18 in the vicinity of the second part 20b.

In the present embodiment, on the other hand, the source electrode 20 is configured so that the film thickness of the first part 20a is greater than the film thickness of the second part 20b, as described above. Therefore, when the SiC semiconductor device of the present embodiment is in the on state, the amount of heat generation in the first part 20a can be made smaller, as compared with the configuration in the film thickness of the first part 20a is the same as the film thickness of the second part 20b. As such, it is possible to suppress the application of a large thermal stress to the gate insulating film 18 in the vicinity of the first part 20a.

In the present embodiment, as described above, the source electrode 20 has the configuration in which the first part 20a has the portion having the greater film thickness than that of the second part 20b. Therefore, when the SiC semiconductor device is in the on state, the amount of heat generation from the first part 20a can be reduced, as compared with the configuration in which the first part 20a has the same film thickness as the film thickness of the second part 20b. As such, it is possible to suppress the application of a large stress to the gate insulating film 18 from the first part 20a, and it is possible to suppress the breakdown of the gate insulating film 18.

In the present embodiment, the source electrode 20 has the second part 20b having a smaller film thickness than that of the first part 20a. Therefore, as compared with the configuration in which the film thickness of the second part 20b is equal to the film thickness of the first part 20a, the length of the second part 20b along the current flow direction can be shortened, so that the resistance can be made smaller. As such, current loss can be reduced.

In addition, the film thickness of the first part 20a and the film thickness of the second part 20b are differentiated from each other by the step 20c, and the step 20c is easily formed by changing the number of times of performing the etching or the like. That is, in the present embodiment, since the film thickness can be easily changed between the first part 20a and the second part 20b by the etching, it is possible to suppress the manufacturing process from being complicated.

Second Embodiment

A second embodiment of the present disclosure will be described hereinafter. In the present embodiment, the shape of the source electrode 20 is changed from that of the first embodiment. The others are same as the first embodiment, and thus descriptions of the same configurations and processes as those of the first embodiment will not be repeated hereinafter.

Figure 5:
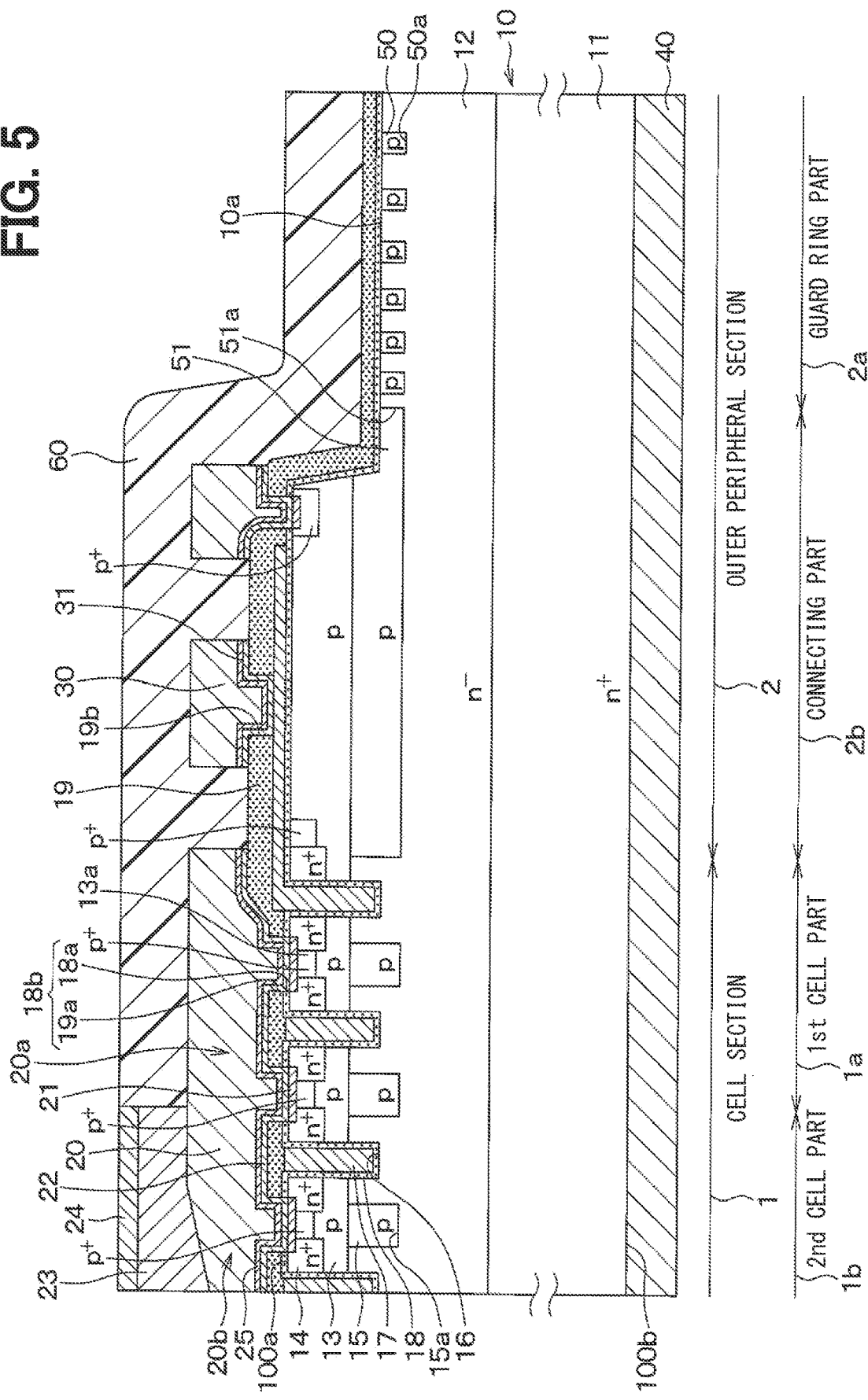
FIG. 5 is a cross-sectional view of a SiC semiconductor device according to a second embodiment of the present disclosure.

In the present embodiment, as shown in FIG. 5, a seed layer 25 provided by a stacked film of Ti/Cu (copper) is formed on the barrier metal 22. The source electrode 20 is formed on the seed layer 25. In the present embodiment, the source electrode 20 is made of a plating film of such as Cu.

Further, the source electrode 20 is configured such that the film thickness of the source electrode 20 gradually decreases from the outer edge portion of the second part 20b adjacent to the first part 20a toward the inner edge portion. That is, the film thickness of the second part 20b gradually reduces as a function of distance from the first part 20a. As such, the source electrode 20 has a configuration in which the first part 20a has a portion having a thicker film thickness than the second part 20b, as in the first embodiment. In the present embodiment, however, the source electrode 20 does not have the step 20c at the boundary between the first part 20a and the second part 20b.

Such a source electrode 20 is formed as follows. First, a seed layer 25 is formed on the barrier metal 22. The seed layer 25 is formed for facilitating the formation of a plating film. Then, the source electrode 20 is formed by forming a Cu plating film on the seed layer 25 by an electric field plating method.

In this case, as described above, the first cell part 1a is a part closer to the outer peripheral part 2 than the second cell part 1b. The contact holes 19a and 19b of the interlayer insulating film 19 are formed more densely in the cell section 1 than in the outer peripheral section 2. Therefore, when the plating film is formed by the electric field plating method, the plating film is likely to be thicker on the outer peripheral section 2 side because the portion of the plating film embedded in the contact hole 19b is smaller on the outer peripheral section 2 side. Since the first cell part 1a is located closer to the outer peripheral section 2 than the second cell part 1b, the portion of the plating film to be formed in the first cell part 1a is more likely to be affected by the outer peripheral section 2 than the portion to be formed in the second cell part 1b. That is, the portion of the plating film formed in the first cell part 1a tends to be thicker due to the influence of the outer peripheral section 2, than the portion of the plating film formed in the second cell part 1b. Therefore, the source electrode 20 has a configuration in which the first part 20a is likely to have a thicker film thickness than the second part 20b, and thus the step 20c is not formed between the first part 20a and the second part 20b.

In the present embodiment, the seed layer 25 is also formed on the barrier metal 31, and the gate wiring 30 is also provided by the plating film.

Even if the source electrode 20 has the configuration in which the film thickness of the second part 20b gradually reduces from the outer edge portion adjacent to the first part 20a toward the inner edge portion, as described above, the similar effects to those of the first embodiment can be achieved. Further, in this configuration, it is not necessary to perform the etching a plurality of times, and the manufacturing process can be simplified.

Third Embodiment

A third embodiment of the present disclosure will be hereinafter described. In the present embodiment, the shape of the source electrode 20 is changed from that of the first embodiment. Descriptions of the same configurations and processes as those of the first embodiment will not be repeated hereinafter.

Figure 6:
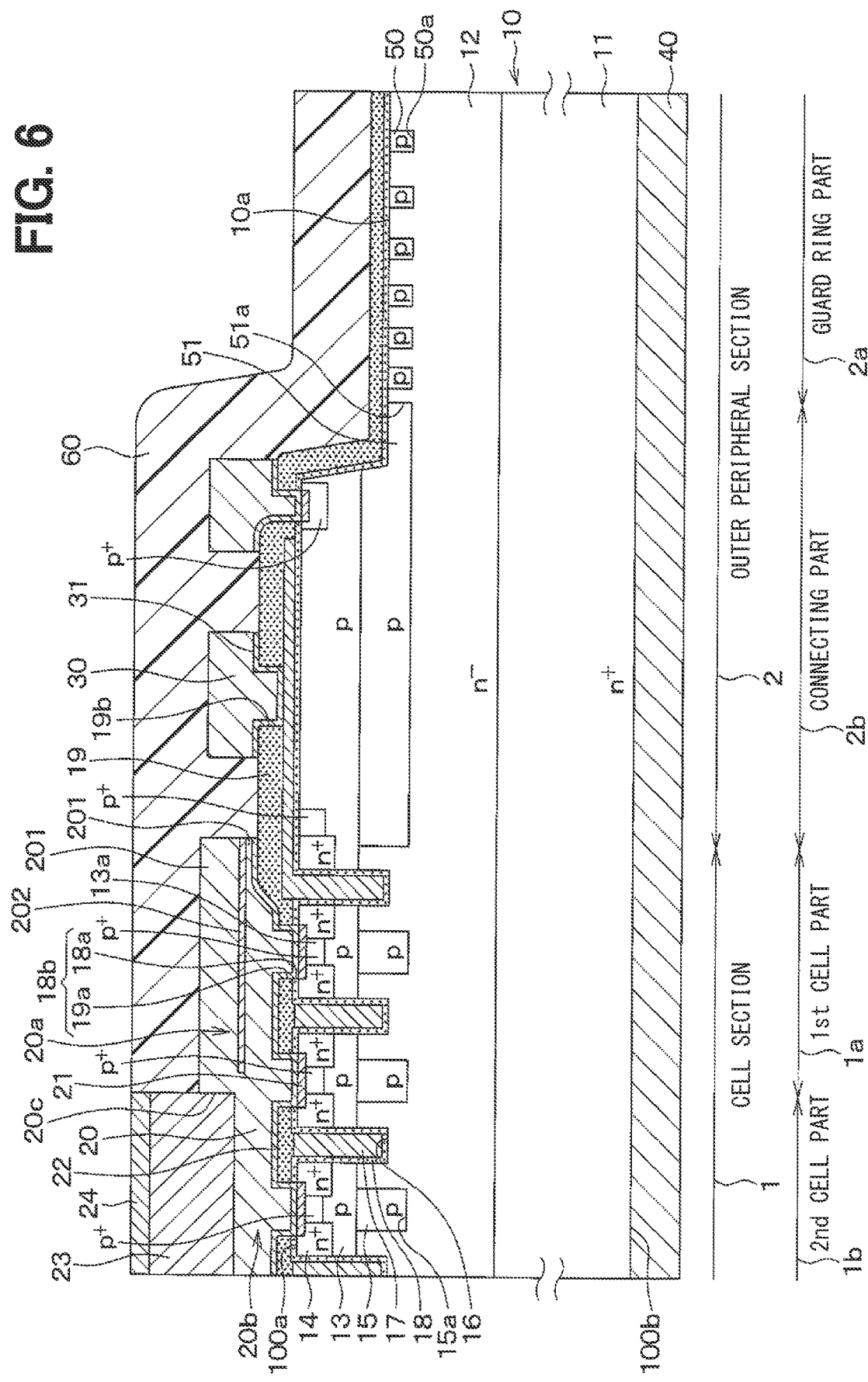
FIG. 6 is a cross-sectional view of a SiC semiconductor device according to a third embodiment of the present disclosure.

In the present embodiment, as shown in FIG. 6, the first part 20a of the source electrode 20 is made of a first metal portion 201 and a second metal portion 202. The second metal portion 202 is made of a material having a resistivity smaller than that of the first metal portion 201. The second metal portion 202 is arranged inside the first metal portion 201. That is, the first part 20a has a configuration in which the first metal portion 201, the second metal portion 202, and the first metal portion 201 are stacked in this order. In the present embodiment, the first metal portion 201 is provided by an Al—Si layer, and the second metal portion 202 is provided by a TiN/Ti stacked film.

Such a source electrode 20 is formed as follows. First, the Al—Si film for forming the first metal portion 201 is formed by sputtering or the like. The Al—Si film is formed to be slightly thicker than the film thickness of the second part 20b. Then, a metal film for forming the second metal portion 202 is formed on the Al—Si film by sputtering or the like. Next, the portion of the metal film located in the second cell part 1b is removed by etching or the like. At this time, the Al—Si film is over-etched in the second cell part 1b. Therefore, the portion of the Al—Si film located in the second cell part 1b is thinner than the portion of the Al—Si film located in the first cell part 1a. Then, the Al—Si film is formed again so as to cover the metal film. As a result, the source electrode 20 in which the second metal portion 202 is arranged in the first metal portion 201 is formed.

In the present embodiment, the first part 20a of the source electrode 20 has the first metal portion 201 and the second metal portion 202 made of a material having a resistivity smaller than that of the first metal portion 201, as described above. Therefore, the resistance can be further reduced, as compared with the configuration in which the first part 20a is made of only the first metal portion 201. As such, when the SiC semiconductor device is in the on state, the amount of heat generation of the first part 20a can be further reduced.

Further, by arranging the first metal portion 201 on the second metal portion 202, the first metal portion 201 located on the second metal portion 202 is likely to have a smaller particle size, and particles are likely to be formed densely, as compared with the configuration in which the first part 20a is made of only the first metal portion 201. Further, when the SiC semiconductor device is in the on state, a large stress is likely to be generated at a triple point of the source electrode 20, the Ni plating layer 23 and the protective film 60 because of the coefficient of thermal expansion of each member being different. In the present embodiment, therefore, it is possible to suppress the breakdown of the source electrode 20, as compared with the configuration in which the first part 20a is formed of only the first metal portion 201.

Modification of Third Embodiment

Figure 7:
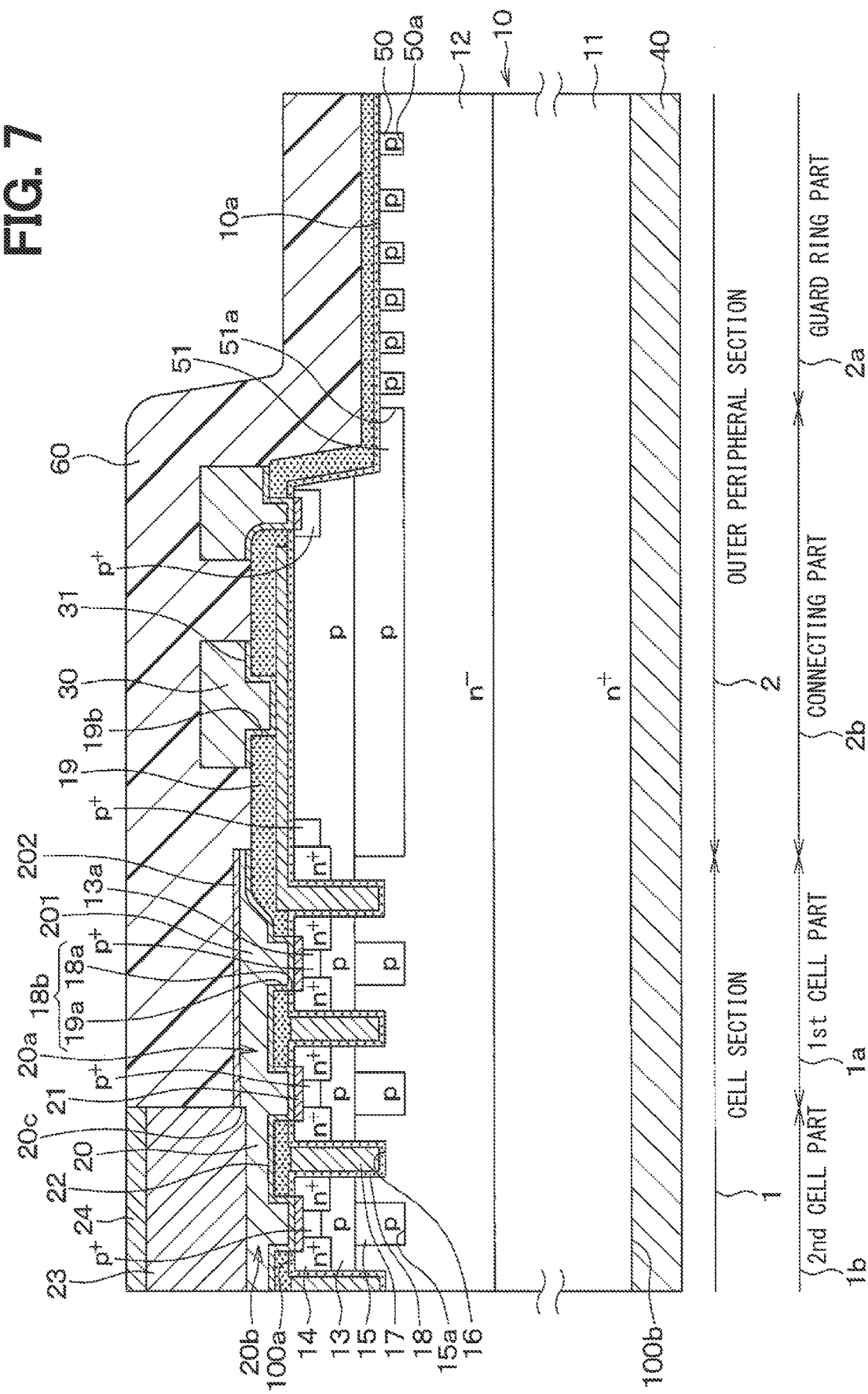
FIG. 7 is a cross-sectional view of a SiC semiconductor device according to a modification of the third embodiment.

A modification of the third embodiment will be hereinafter described. In the third embodiment, as shown in FIG. 7, the first part 20a may be formed of the first metal portion 201 and the second metal portion 202 stacked on the first metal portion 201. Also in such a configuration, the advantageous effects similar to those of the third embodiment can be achieved.

Fourth Embodiment

A fourth embodiment of the present disclosure will be hereinafter described. In the present embodiment, the shape of the source electrode 20 is changed from that of the first embodiment. Descriptions of the same configurations and processes as those of the first embodiment will not be repeated hereinafter.

Figure 8:
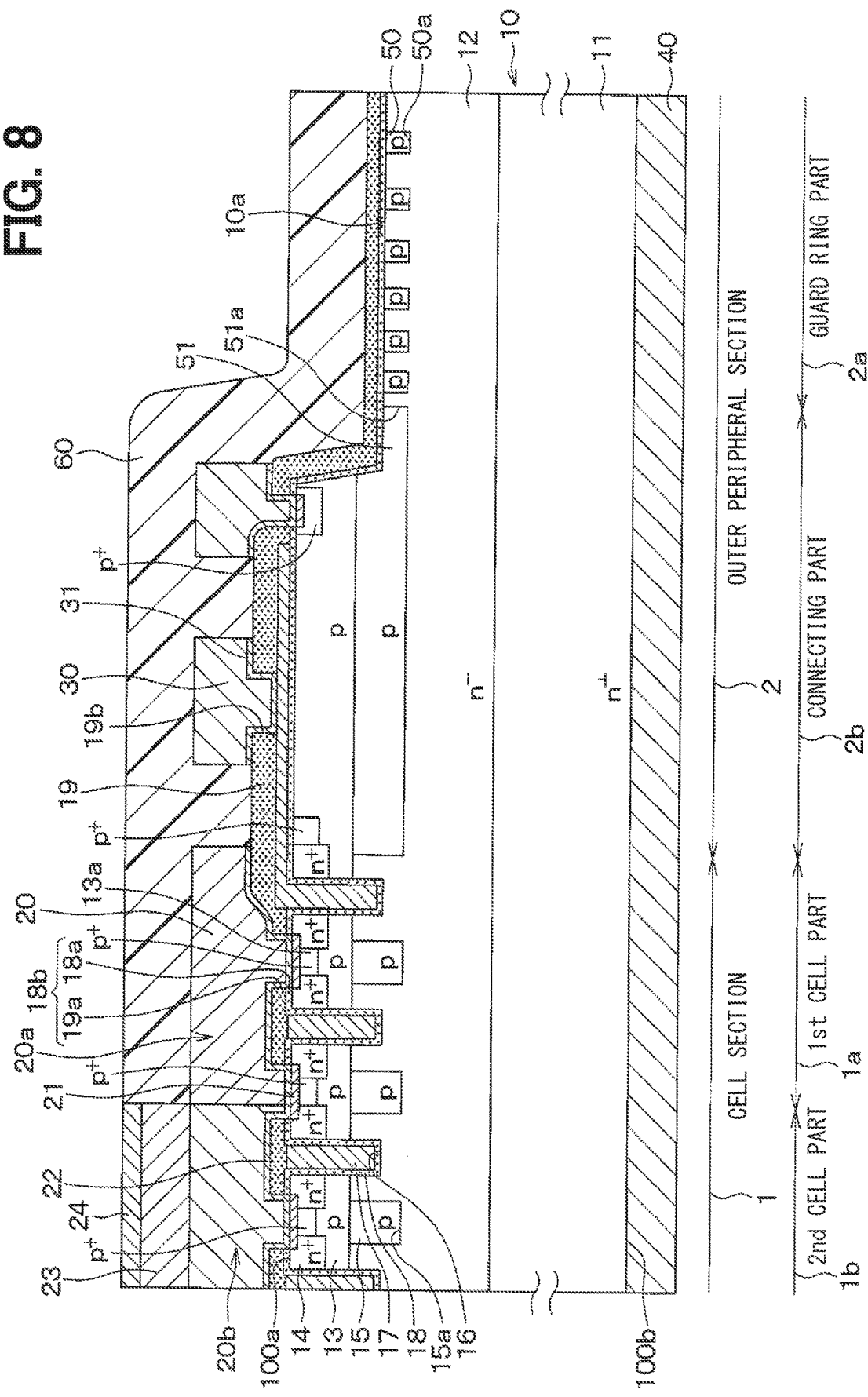
FIG. 8 is a cross-sectional view of a SiC semiconductor device according to a fourth embodiment of the present disclosure.

In the present embodiment, as shown in FIG. 8, in the source electrode 20, the film thickness of the first part 20a and the film thickness of the second part 20b are the same. However, the first part 20a is made of a material having a smaller resistivity than that of the second part 20b. In the present embodiment, the first part 20a is provided by a Cu layer and the second part 20b is provided by an Al—Si layer.

In the present embodiment, since the first part 20a is provided by the Cu layer and the second part 20b is provided by the Al—Si layer, the second part 20b is made of a softer material than the first part 20a. That is, the second part 20b is made of a material having a hardness lower than that of the first part 20a.

In the present embodiment, as described above, the source electrode 20 is configured such that the first part 20a has a resistivity smaller than that of the second part 20b. Therefore, when the SiC semiconductor device is in the on state, the amount of heat generation in the first part 20a can be reduced, as compared with the configuration in which the first part 20a is made of the same material as the second part 20b. As such, the similar effects to those of the first embodiment can be achieved.

Further, the source electrode 20 is configured such that the second part 20b has a hardness smaller than that of the first part 20a. Therefore, when the SiC semiconductor device is in the on state, the stress can be easily relaxed at the second part 20b, as compared with the configuration in which the second part 20b is made of the same material as the first part 20a. As such, it is possible to suppress the breakdown of the semiconductor device.

Other Embodiments

Although the present disclosure is described hereinabove based on the embodiments, the present disclosure is not limited to the embodiments and the structures described above. The present disclosure encompasses various modifications and variations within the scope of equivalents. In addition, various combinations and forms, and further, other combinations and forms including only one element, or more or less than these elements are also within the scope and the scope of the present disclosure.

For example, in each of the embodiments described above, the SiC semiconductor device has been described as an example of the semiconductor device. However, the SiC semiconductor device is an example, and each of the embodiments described above can be applied to a semiconductor device using other semiconductor materials, that is, silicon or a compound semiconductor.

In each of the embodiments described above, an n-channel type MOSFET element in which the first conductivity type is an n-type and the second conductivity type is a p-type has been described as an example. Alternatively, the MOSFET element may be a p-channel type in which the conductivity type of each component is inverted from the n-channel type MOSFET element. Further, each of the embodiments described above can be applied not only to the MOSFET element but also to an IGBT element having a similar structure, as the semiconductor element. In case of the IGBT element, only the conductivity type of the substrate 11 is changed from the n-type to the p-type in each of the embodiments described above, and other structures are the same as those of each of the embodiments described above. In each of the embodiments described above, the vertical MOSFET element having the trench gate structure has been described as an example. However, the semiconductor element is not limited to the trench gate structure, but may be a planar type.

In each of the embodiments described above, it is assumed that the source region 14 is formed by ion implantation. Alternatively, the source region 14 can be formed by epitaxial growth.

Figure 9:
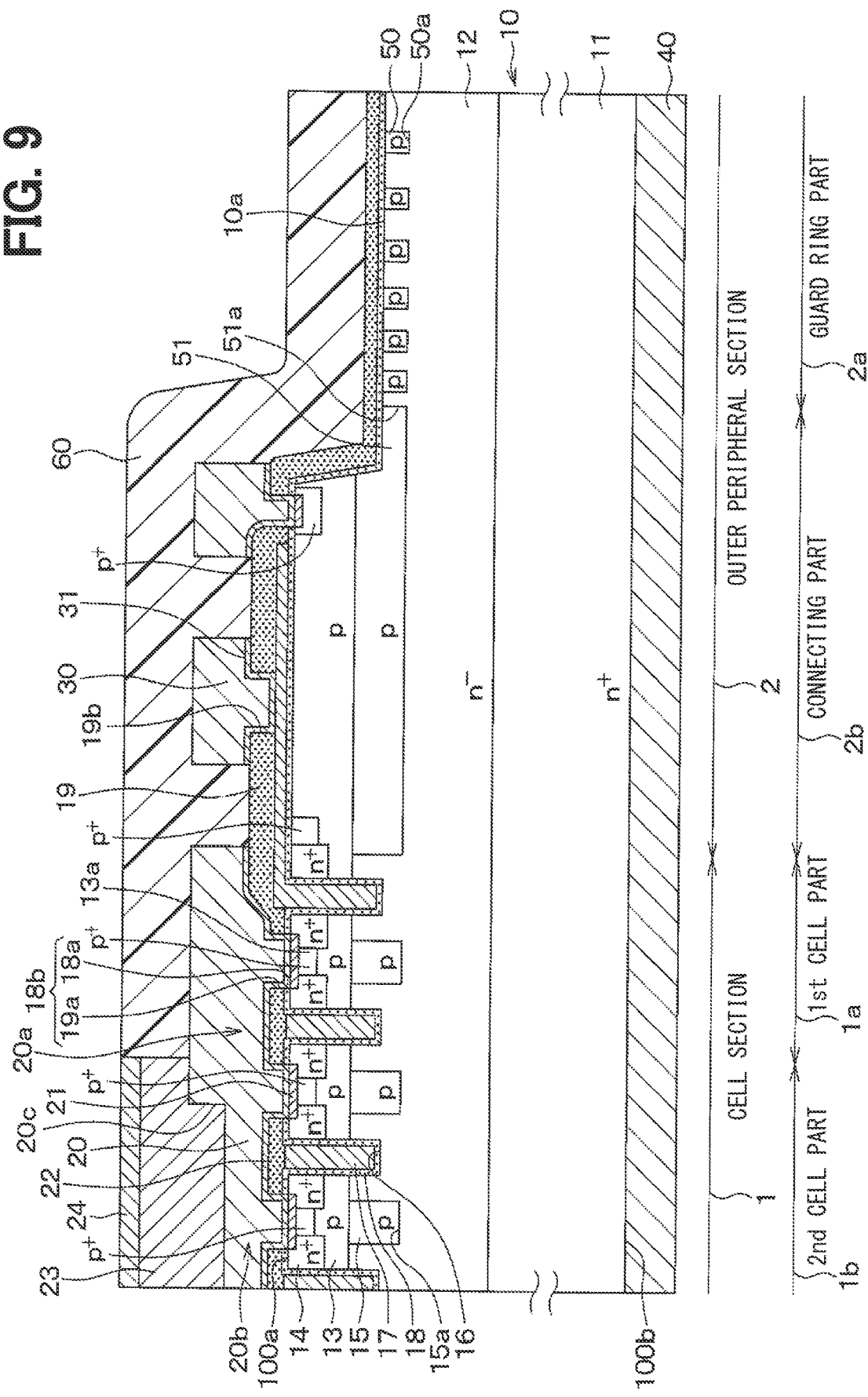
FIG. 9 is a cross-sectional view of a SiC semiconductor device according to another embodiment of the present disclosure.

In the first embodiment, the source electrode 20 may not have the step 20c at the boundary portion between the first part 20a and the second part 20b. For example, as shown in FIG. 9, the source electrode 20 may have the step 20c at a position located in the second part 20b. That is, the source electrode 20 may have a configuration in which the outer edge portion of the second part 20b adjacent to the first part 20a has the same structure as that of the first part 20a, and thus to have a thicker film thickness as the first part 20a. Further, although not particularly shown, the source electrode 20 may have the step 20c at a position located in the first part 20a. That is, the source electrode 20 may have a configuration in which the inner edge portion of the first part 20a adjacent to the second part 20b has the same structure as that of the second part 20b. Also in such a configuration, since the first part 20a has a portion having a thicker film thickness than the second part 20b, the similar effects to those of the first embodiment can be achieved.

As shown in FIG. 10, the protective film 60 may have a tapered shape at a part adjacent to the Ni plating layer 23 and the Au layer 24.

Although not particularly shown, in the second embodiment, the source electrode 20 may be configured such that the film thickness gradually decreases from the inner edge portion of the first part 20a toward the inner edge portion of the second part 20b. Although not particularly shown, in the third embodiment, the outer edge portion of the second part 20b adjacent to the first part 20a may have the same configuration as that of the first part 20a. Similarly, in the third embodiment, the inner edge portion of the first part 20a adjacent to the second part 20b may have the same configuration as the second part 20b. Although not particularly shown, in the fourth embodiment, the outer edge portion of the second part 20b adjacent to the first part 20a may have the same configuration as that of the first part 20a. Similarly, in the fourth embodiment, the inner edge portion of the first part 20a adjacent to the second part 20b may have the same configuration as the second part 20b. Also in these configurations, the protective film 60 may have a tapered shape on the side adjacent to the Ni plating layer 23 and the Au layer 24.

Furthermore, the embodiments described above can be appropriately combined to each other. For example, each of the first to third embodiments may be combined with the fourth embodiment so that the first part 20a is made of a material having a resistivity lower than that of the second part 20b. Moreover, combinations of the above embodiments may be further appropriately combined together.

What is claimed is:

1. A semiconductor device comprising:
a cell section; and
an outer peripheral section surrounding the cell section, wherein
the cell section includes a semiconductor substrate, a plurality of gate structures, a first electrode, and a second electrode,
the semiconductor substrate has a first surface, and includes:
a drift layer of a first conductivity type;
a base region of a second conductivity type, the base region being disposed on the drift layer and adjacent to the first surface;
a first high impurity concentration region of the first conductivity type, the first high impurity concentration region having an impurity concentration higher than that of the drift layer, and being disposed in a surface layer portion of the base region; and
a second high impurity concentration region of the first conductivity type or the second conductivity type, the second high impurity concentration region having an impurity concentration higher than that of the drift layer, and being disposed opposite to the base region with respect to the drift layer,
each of the gate structures includes:
a gate insulating film disposed in a part including a surface of the base region interposed between the first high impurity concentration region and the drift layer; and
a gate electrode disposed on the gate insulating film,
the first electrode is electrically connected to the base region and the first high impurity concentration region through a contact hole of the gate insulating film, the contact hole being at a part different from a part on which the gate electrode is disposed,
the second electrode is electrically connected to the second high impurity concentration region,
the cell section and the outer peripheral section include a protective film made of a material having a lower thermal conductivity than that of the first electrode,
the protective film is disposed to extend from the outer peripheral section to an outer edge portion of the cell section adjacent to the outer peripheral section and to cover a portion of the first electrode adjacent to the outer peripheral section,
the cell section includes a first cell part in a region that overlaps with the protective film in a stacking direction of the drift layer and the base region, and a second cell part in a region different from the first cell part, the gate structures are disposed in the first cell part and the second cell part, the first electrode has a first electrode part located in the first cell part, and a second electrode part located in the second cell part, and the first electrode part includes a thick portion having a film thickness greater than that of the second electrode part, the film thickness being defined by a thickness of the first electrode from the first surface of the semiconductor substrate to a surface of the first electrode opposite to the first surface of the semiconductor substrate, and the second electrode part has the film thickness that reduces from an outer edge portion of the second electrode part adjacent to the first electrode part towards an inner edge portion.

2. The semiconductor device according to claim 1, wherein
the first electrode is made of a material that includes at least one of Al—Si and Cu.

3. The semiconductor device according to claim 1, wherein
the first electrode part includes a first metal potion and a second metal portion having a resistivity lower than that of the first metal portion, and
the second electrode part is made of a same material as that of the first metal portion.

4. The semiconductor device according to claim 3, wherein
the first electrode part includes a stacked portion in which the first metal portion, the second metal portion and the first metal portion are stacked on top of another.

5. The semiconductor device according to claim 1, wherein
the first electrode part of the first electrode is made of a material having a resistivity smaller than that of the second electrode part of the first electrode.

6. A semiconductor device comprising:
a cell section; and
an outer peripheral section surrounding the cell section, wherein
the cell section includes a semiconductor substrate, a plurality of gate structures, a first electrode, and a second electrode,
the semiconductor substrate has a first surface, and includes:
a drift layer of a first conductivity type;
a base region of a second conductivity type, the base region being disposed on the drift layer and adjacent to the first surface;
a first high impurity concentration region of the first conductivity type, the first high impurity concentration region having an impurity concentration higher than that of the drift layer, and being disposed in a surface layer portion of the base region; and
a second high impurity concentration region of the first conductivity type or the second conductivity type, the second high impurity concentration region having an impurity concentration higher than that of the drift layer, and being disposed opposite to the base region with respect to the drift layer,
each of the gate structures includes:
a gate insulating film disposed in a part including a surface of the base region interposed between the first high impurity concentration region and the drift layer; and
a gate electrode disposed on the gate insulating film, the first electrode is electrically connected to the base region and the first high impurity concentration region through a contact hole of the gate insulating film, the contact hole being at a part different from a part on which the gate electrode is disposed, the second electrode is electrically connected to the second high impurity concentration region, the cell section and the outer peripheral section include a protective film made of a material having a lower thermal conductivity than that of the first electrode, the protective film is disposed to extend from the outer peripheral section to an outer edge portion of the cell section adjacent to the outer peripheral section and to cover a portion of the first electrode adjacent to the outer peripheral section, the cell section includes a first cell part in a region that overlaps with the protective film in a stacking direction of the drift layer and the base region, and a second cell part in a region different from the first cell part, the gate structures are disposed in the first cell part and the second cell part, the first electrode has a first electrode part located in the first cell part, and a second electrode part located in the second cell part, and the first electrode part includes a thick portion having a film thickness greater than that of the second electrode part, the film thickness being defined by a thickness of the first electrode from the first surface of the semiconductor substrate to a surface of the first electrode opposite to the first surface of the semiconductor substrate, the first electrode part includes a first metal potion and a second metal portion having a resistivity lower than that of the first metal portion, and
the second electrode part is made of a same material as that of the first metal portion.

7. The semiconductor device according to claim 6, wherein
the first electrode part includes a stacked portion in which the first metal portion, the second metal portion and the first metal portion are stacked on top of another.

8. The semiconductor device according to claim 7, wherein
the first metal portion is made of a material containing Al—Si, and
the second metal portion is made of a material containing Ti.

9. The semiconductor device according to claim 6, wherein
the first electrode has a step portion at a boundary between the first electrode part and the second electrode part and on the second electrode part side.

10. The semiconductor device according to claim 6, wherein
the first electrode part of the first electrode is made of a material having a resistivity smaller than that of the second electrode part of the first electrode.

11. A semiconductor device comprising:
a cell section; and
an outer peripheral section surrounding the cell section, wherein
the cell section includes a semiconductor substrate, a plurality of gate structures, a first electrode, and a second electrode,
the semiconductor substrate has a first surface, and includes:
a drift layer of a first conductivity type;

a base region of a second conductivity type, the base region being disposed on the drift layer and adjacent to the first surface;

a first high impurity concentration region of the first conductivity type, the first high impurity concentration region having an impurity concentration higher than that of the drift layer, and being disposed in a surface layer portion of the base region; and a second high impurity concentration region of the first conductivity type or the second conductivity type, the second high impurity concentration region having an impurity concentration higher than that of the drift layer, and being disposed opposite to the base region with respect to the drift layer, each of the gate structures includes:
  a gate insulating film disposed in a part including a surface of the base region interposed between the first high impurity concentration region and the drift layer; and
  a gate electrode disposed on the gate insulating film, the first electrode is electrically connected to the base region and the first high impurity concentration region through a contact hole of the gate insulating film, the contact hole being at a part different from a part on which the gate electrode is disposed, the second electrode is electrically connected to the second high impurity concentration region, the cell section and the outer peripheral section include a protective film made of a material having a lower thermal conductivity than that of the first electrode, the protective film is disposed to extend from the outer peripheral section to an outer edge portion of the cell section adjacent to the outer peripheral section and to cover a portion of the first electrode adjacent to the outer peripheral section, the cell section includes a first cell part in a region that overlaps with the protective film in a stacking direction of the drift layer and the base region, and a second cell part in a region different from the first cell part, the gate structures are disposed in the first cell part and the second cell part, the first electrode has a first electrode part located in the first cell part, and a second electrode part located in the second cell part, and the first electrode part includes a thick portion having a film thickness greater than that of the second electrode part, the film thickness being defined by a thickness of the first electrode from the first surface of the semiconductor substrate to a surface of the first electrode opposite to the first surface of the semiconductor substrate, and the first electrode part is made of a material having a resistivity smaller than that of the second electrode part of the first electrode.

12. The semiconductor device according to claim 11, wherein
the first electrode has a step portion at a boundary between the first electrode part and the second electrode part and on the second electrode part side.

13. A semiconductor device comprising:
a cell section; and
an outer peripheral section surrounding the cell section, wherein the cell section includes:
  a drift layer of a first conductivity type;
  a base region of a second conductivity type, the base region being disposed on the drift layer;
  a first high impurity concentration region of the first conductivity type, the first high impurity concentration region having an impurity concentration higher than that of the drift layer, and being disposed in a surface layer portion of the base region;
  a plurality of gate structures, each of the gate structures includes a gate insulating film disposed in a part including a surface of the base region interposed between the first high impurity concentration region and the drift layer, and a gate electrode disposed on the gate insulating film;
  a second high impurity concentration region of the first conductivity type or the second conductivity type, the second high impurity concentration region having an impurity concentration higher than that of the drift layer, and being disposed opposite to the base region with respect to the drift layer;
  a first electrode being electrically connected to the base region and the first high impurity concentration region through a contact hole of the gate insulating film, the contact hole being at a part different from a part on which the gate electrode is disposed; and
  a second electrode being electrically connected to the second high impurity concentration region, the cell section and the outer peripheral section includes a protective film made of a material having a lower thermal conductivity than that of the first electrode, the protective film is disposed to extend from the outer peripheral section to an outer edge portion of the cell section adjacent to the outer peripheral section and to cover a portion of the first electrode adjacent to the outer peripheral section, the cell section includes a first cell part in a region that overlaps with the protective film in a stacking direction of the drift layer and the base region, and a second cell part in a region different from the first cell part, the gate structures are disposed in the first cell part and the second cell part, the first electrode includes a first electrode part that is located in the first cell part and covered with the protective film, and a second electrode part that is located in the second cell part and adjoins the first electrode part in a direction intersecting the stacking direction on a side opposite to the outer peripheral section, and the first electrode part is made of a material having a lower resistivity than the second electrode part.

14. The semiconductor device according to claim 13, wherein
the first electrode part is made of a material containing Cu, and
the second electrode part is made of a material containing Al—Si.

* * * * *